United States Patent [19]

Hatta et al.

[11] Patent Number: 4,803,527
[45] Date of Patent: Feb. 7, 1989

[54] SEMICONDUCTOR INTEGRATED CIRCUIT DEVICE HAVING SEMI-INSULATOR SUBSTRATE

[75] Inventors: Yasushi Hatta, Tokyo; Kazumichi Mitsusada, Kodaira; Hirotoshi Tanaka, Yamanashi; Takehisa Hayashi, Kodaira, all of Japan

[73] Assignee: Hitachi, Ltd., Tokyo, Japan

[21] Appl. No.: 876,466

[22] Filed: Jun. 20, 1986

[30] Foreign Application Priority Data

Jun. 21, 1985 [JP] Japan .................. 60-134019

[51] Int. Cl.$^4$ .................. H01L 29/90; H01L 29/78
[52] U.S. Cl. .................. 357/13; 357/23.13; 357/22; 307/200 B; 361/56; 361/91
[58] Field of Search .................. 357/23.13, 13, 22; 307/200 B; 361/56, 91

[56] References Cited

U.S. PATENT DOCUMENTS

| | | | |
|---|---|---|---|
| 4,258,311 | 3/1981 | Tokuda et al. | 357/13 |
| 4,356,502 | 10/1982 | Yamada | 357/23.13 |
| 4,396,437 | 8/1983 | Kwok et al. | 357/22 |
| 4,683,443 | 7/1987 | Young et al. | 361/91 |

FOREIGN PATENT DOCUMENTS

| | | | |
|---|---|---|---|
| 0162460 | 11/1985 | European Pat. Off. | 357/23.13 |
| 3334167 | 4/1985 | Fed. Rep. of Germany | 357/13 |
| 52-75987 | 6/1977 | Japan | 357/23.13 |
| 58-206173 | 12/1983 | Japan | 357/13 |
| 59-224164 | 12/1984 | Japan | 357/23.13 |

OTHER PUBLICATIONS

*Electrical Overstress/Electrostatic Discharge Symposium Proceedings* 1984 Phila. PA "A CMOS . . . DIFIDW" Lin et al. pp. 202–209.
Eden, "Capacitor . . . D-MESFET IC's" GaAs Symposium Oct. 84 pp. 11–14.

Primary Examiner—Andrew J. James
Assistant Examiner—Jerome Jackson
Attorney, Agent, or Firm—Antonelli, Terry & Wands

[57] ABSTRACT

Disclosed is a semiconductor integrated circuit device forming MESFETs by use of a semi-insulator GaAs substrate which prevents destruction of an electrostatic destruction protect circuit and a Schottky junction of an internal circuit by causing a part of electrostatic energy, which is applied to external terminals, to flow from a semiconductor region connected to the external terminals into another semiconductor region which is formed in the vicinity of the semiconductor region described above and to which a predetermined fixed potential is applied.

7 Claims, 6 Drawing Sheets

SEMICONDUCTOR INTEGRATED CIRCUIT DEVICE HAVING SEMI-INSULATOR SUBSTRATE

BACKGROUND OF THE INVENTION

This invention relates generally to semiconductor integrated circuit devices and more particularly, to techniques which can be effectively applied to semiconductor integrated circuit devices having Schlottky gate type field effect transistors (hereinafter referred to as "MESFETs").

It is a recent trend in semiconductor integrated circuit devices to arrange MESFETs on a semi-insulator substrate made of gallium aresenide (GaAs) having great carrier mobility in order to increase operation speed. In the semiconductor integrated circuit devices having this GaAs substrate, however, so-called "electrostatic destruction", that is, the breakdown of an input stage circuit connected to input terminals (bonding pads) by excessive electrostatic energy, is likely to occur in the same way as in semiconductor integrated circuit devices using a silicon substrate.

Therefore, an electrostatic destruction protect circuit is disposed between the input terminal and the input stage circuit, as disclosed, for example, in the article "CDFL Circuit Approach For GaAs D-MESFET IC'S" reported by R. C. Eden in GaAs IC Symposium, October, 1984. This electrostatic destruction protect circuit consists of a resistance element which mitigates the excessive current and a clamp diode which clamps the excessive current.

SUMMARY OF THE INVENTION

It is an object of the present invention to provide an arrangement which can improve reliability of semiconductor integrated circuit devices having MESFETs to electrostatic destruction.

It is another object of the present invention to provide an arrangement which can improve reliability of semiconductor integrated circuit devices having MESFETs and can also improves its operation speed.

These and other objects and novel features of the present invention will become more apparent from the following description when taken in conjunction with the accompanying drawings.

Among the inventions disclosed herein, the following will illustrate a typical example.

In accordance with the present invention, a semiconductor region to which a fixed voltage is applied is disposed in a portion of a semi-insulator substrate in the vicinity of external terminals so as to absorb part of electrostatic energy applied to the external terminal. Since this arrangement can reduce an excessive current flowing through an electrostatic destruction protect circuit, it can improve electrical reliability of the electrostatic destruction protect circuit when handling such an excessive current. Furthermore, operation speed can be sped up because the resistance value of a protective resistance element of the electrostatic destruction protect circuit is reduced.

DESCRIPTION OF THE PREFERRED EMBODIMENTS

Figure 1:
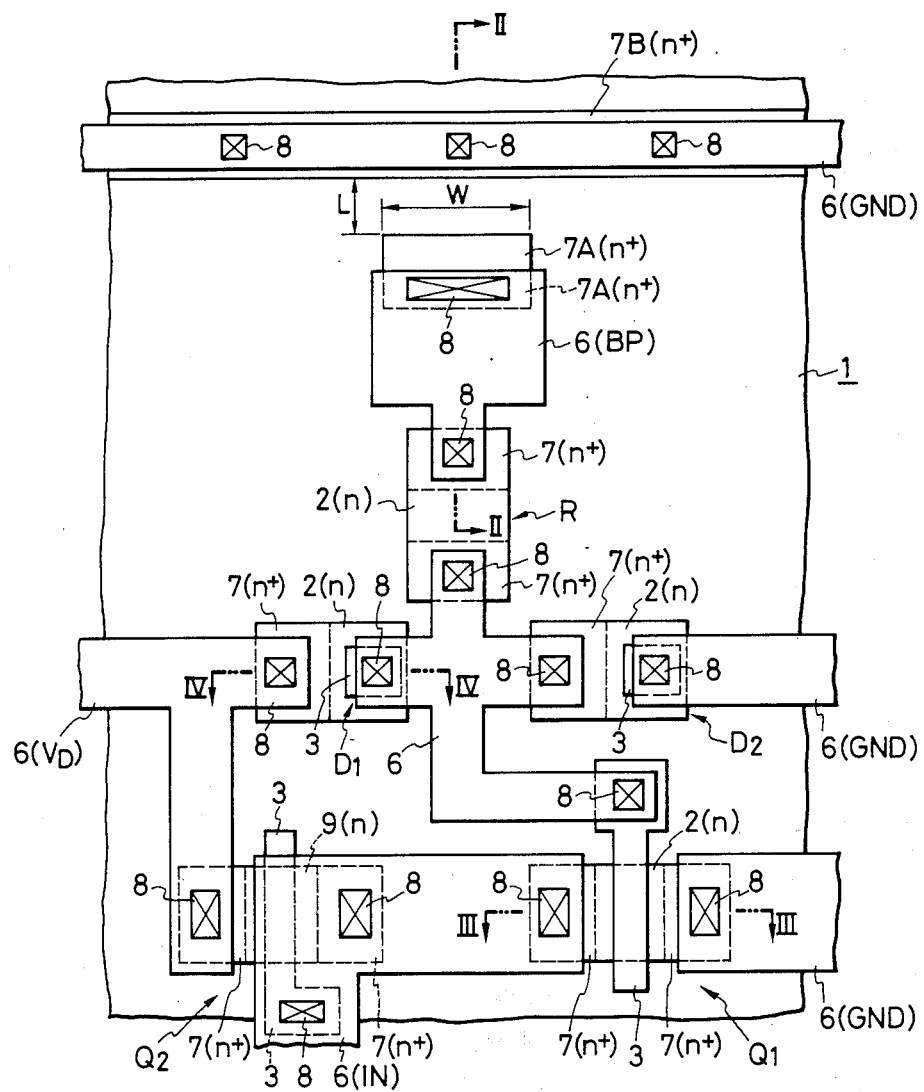
FIG. 1 is a plan view showing a definite construction of an input portion of a semiconductor integrated circuit device in accordance with a first embodiment of the present invention.

FIG. 1 shows an embodiment wherein the present invention is applied to the input portion of a semiconductor integrated circuit device which uses a semiinsulator substrate 1 made of undoped or Cr-doped gallium arsenide (GaAs: having specific resistance $\rho$ of at least $10^7$ ohms.cm). Incidentally, like reference numberlas are used throughout the drawings to represent constituents having the same function, and repetition of the description of such constituents will be omitted.

Figure 6:
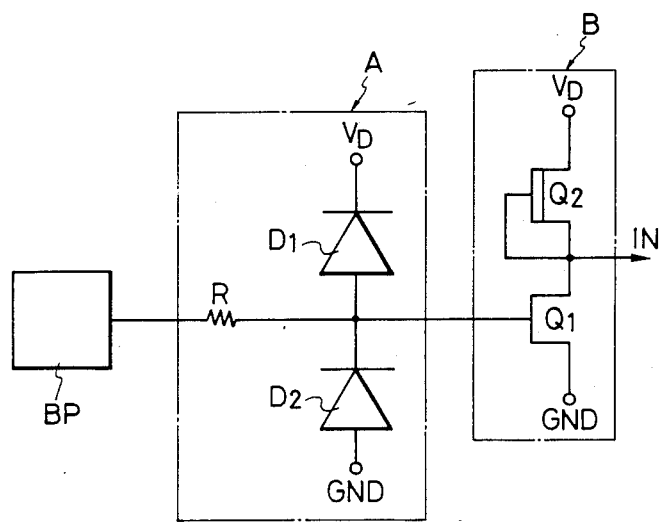
FIG. 6 is a circuit diagram of an electrostatic destruction protect circuit disposed in the semiconductor integrated circuit device shown in FIG. 1.

The input portion shown in FIG. 1 includes a bonding pad (BP) as an input terminal, an electrostatic destruction protect circuit (i.e., an input protect circuit), an input stage circuit as the initial stage of an internal circuit and the structure of the present invention for further assisting in the prevention of electrostatic destruction even in situations involving excessive current. As shown in FIG. 6, the input terminal BP is electrically connected to the input stage circuit B of the internal circuit while interposing the electrostatic destruction protect circuit A between them. Input signals (e.g. a low level signal of 0 V or a high level signal of 0.7 V) are applied to the input terminal BP from outside the semiconductor integrated circuit device in order to apply these signals to the internal circuit.

As shown in FIG. 6, the electrostatic destruction protect circuit A comprises a resistance element R and clamp diodes $D_1$, $D_2$, each comprising a Schottky diode. The input stage circuit B comprises a normallyoff (enhancement type) MESFET $Q_1$ and a normally-on (depletion type) MESFET $Q_2$.

Incidentally, symbol $V_D$ represents a power source voltage (an operating voltage of the circuit such as 2.0 V), GND is a reference voltage (a ground voltage of the circuit such as 0 V) and IN is an output signal of the input stage circuit B, which is inputted to other internal circuits.

Figure 3:
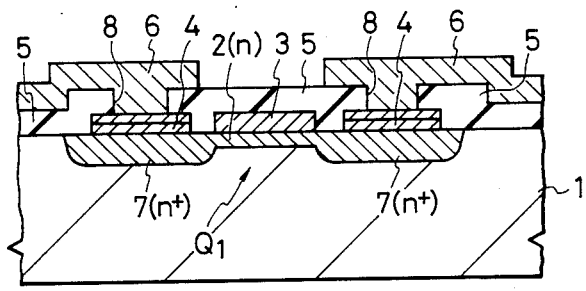
FIG. 3 is a sectional view taken along line III—III of FIG. 1.

As shown in FIGS. 1 and 3, MESFET $Q_1$ of the input stage circuit B comprises an n-type semiconductor region 2 as a channel region, a metal layer 3 which is a gate electrode and constitutes a Schottky junction together with the region 2, and an n+-type semiconductor region 7 as source and drain regions. As shown in FIG. 1, MESFET $Q_2$ comprises an n-type semiconductor region 9 as a channel region, a metal layer 3 as a gate electrode and an n+-type region 7 as source and drain regions. In order to turn MESFET $Q_2$ to the depletion type, the channel region 9 has a junction depth (about 0.2 μm) which is deeper than the channel region 2 (about 0.1 μm). The regions 2 and 9 have lower inpurity concentration than the region 7 in order to form the Schottky junction between it and the gate electrode 3.

Figure 4:
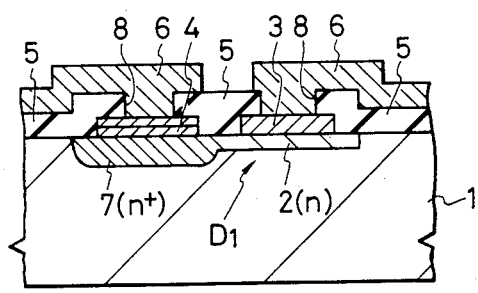
FIG. 4 is a sectional view taken along line IV—IV of FIG. 1.

As shown in FIGS. 1 and 4, the clamp diodes $D_1$, $D_2$ of the electrostatic destruction protect circuit A comprise an n-type semiconductor region 2, a metal layer 2 and an n+-type semiconductor region 7. The Schottky junction is formed between the semiconductor region 2 and the metal layer 3. The region 7 is a region for connecting a wiring to the region 2 which is one of the electrodes of the diode. The resistance element R comprises the n-type semiconductor region 2 as a resistor and the n+-type semiconductor region 7, which is disposed at both end portions of the region 2, as a connection portion with the wiring.

The metal layer 3 is made, for example, of a 3000 Å-thick tungsten silicide ($W_2Si$) layer. In order to form the Schottky junctions between the tungsten silicide layer 3, the semiconductor regions 2 and 9 are formed by ion-implanting silicon in relatively low doess of about $2 \times 10^{12}/cm^2$ and about $4 \times 10^{12}/cm^2$ into the substrate, respectively. The Schottky barrier height between the tungsten silicide layer 3 and the semiconductor region 2 is about 0.7 eV, for example.

As shown in FIGS. 1, 3 and 4, a wiring layer 6 is connected to the semiconductor region 7 and to the metal layer 3 through a connection hole 8 formed in an insulating film 5. The wiring layer 6 is made of, for example, a 8000 Å-thick gold (Au) layer. A metal layer 4 is formed in order to establish ohmic contact between the wiring layer 6 and the semiconductor region 7. In FIG. 1 (as well as in laterappearing FIGS. 7, 8 and 9), the metal layer 4 is omitted for clarity of illustration. This metal layer 4 is disposed at the upper part of the semiconductor region 7 in such a manner as to be connected thereto. As shown in FIGS. 3 and 4, the metal layer 4 comprises, for example, a laminate of a 1000 Å-thick gold-germanium (Au-Ge) film of a lower layer and a 1000 Å-thick nickel (Ni) film of an upper layer formed on the Au-Ge layer. The semiconductor region 7 is formed by ion-implanting silicon in a relative high dose of about $2 \times 10^{13}/cm^2$ into the substrate 1. The insulating film 5 consists of an $SiO_2$ film, for example, The wiring layer 6 is used as a wiring between each semiconductor device (e.g. $Q_1$, $Q_2$, $D_1$, $D_2$), a wiring for supplying the power source voltage $V_D$, a wiring for supplying the ground potential GND and the bonding pad BP.

Figure 2:
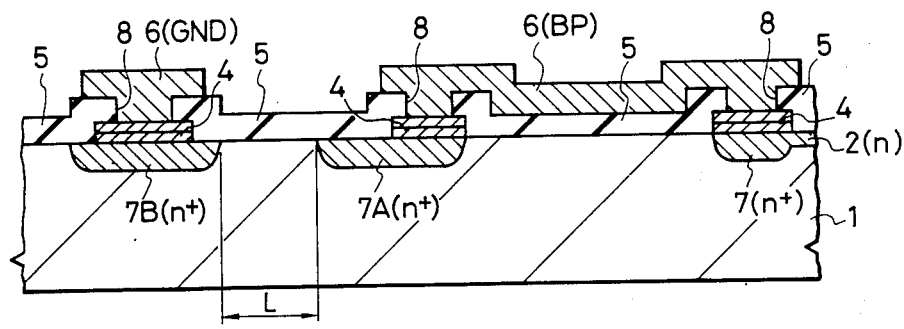
FIG. 2 is a sectional view taken along line II—II of FIG. 1.

The structure for preventing electrostatic destruction in accordance with the present invention is added to the electrostatic destruction protect circuit A described above. As shown in FIGS. 1 and 2, the electrostatic destruction protect structure is constructed of two n+-type semiconductor regions 7A and 7B that face each otehr with a distance L. One (7A) of the semiconductor regions is connected to the metal layer 4 and the bonding pad BP (6). The other semiconductor region 7B receives a fixed potential such as the ground potential GND of the circuit by the wiring layer 6 through the metal layer 4. The portion between these two n+-type semiconductor regions is the semi-insulating GaAs substrate 1. The region 7A has a width W and faces the region 7B at this portion. The regions 7A and 7B are formed by the same production step as the region 7.

In this embodiment, electrostatic destruction of the semiconductor integrated circuit device having MESFETs and shown in FIG. 1 is prevented in the following way.

MESFET $Q_1$, which receives at its gate the external signal from the input terminal BP, is protected by the electrostatic destruction protect circuit A. When a voltage higher than 2.7 V (the sum of $V_D$ and the Schottky barrier height) is applied to the input terminal BP, the electrostatic energy (current) is divided into two parts, one being absorbed by the power source potential $V_D$ through the diode $D_1$. When a voltage lower than −0.7 V (the Schottky barrier height) is applied to the input terminal BP, the electrostatic energy (current) is divided into two parts, one being absorbed by the ground potential GND through the diode $D_2$. As a result, the voltage applied to the gate of MESFET $Q_1$ drops. The rise waveform of the voltage applied to the gate of MESFET $Q_1$ become softer than that of the voltage of the electrostatic energy applied to the input terminal BP due to the resistor R and parasitic capacity of the diodes $D_1$, $D_2$. Therefore, the Schottky junction of the gate of MESFET $Q_1$ is protected from destruction.

In addition, the semiconductor regions 7A and 7B protect the Schottky junction of MESFET $Q_1$ and the diodes $D_1$, $D_2$ from destruction. When an extremely high or low voltage (e.g. a voltage higher than +10 V or lower than −10 V) is applied by the electrostatic energy to the input terminal BP, a current flowing between the semiconductor regions 7A and 7B increases drastically (or the regions undergo breakdown). This breakdown voltage is proportional to the square of the distance L. When the distance L is 2 μm and the width W is 100 μm, for example, the absolute value of the potential difference between these regions when the regions 7A and 7B become conductive is about 10 V. This drastic increase of the current occurs in the following manner. Namely, when an extremely high or low voltage is applied to the input terminal BP, electrons are injected from the semiconductor region 7A or 7B into the substrate 1 due to the field effect. The electrons thus injected fill a trapping level. An EL2 level which governs the semi-insulating property of the GaAs crystal and is a deep donor level is also filled by the electrons. When the EL2 levels existing between the regions 7A and 7B are mostly filled, the current increases drastically between the regions 7A and 7B. In other words, voltage-current characteristics between the regions 7A and 7B enter a space charge limited region.

As described above, when the electrostatic energy applied to the input terminal BP is great, the energy is absorbed by the region 7B from the input terminal BP through the region 7A and then, by the electrostatic destruction protect circuit A. Since the electrostatic energy is divided, excessive current flowing through the electrostatic destruction protect circuit A and through the input stage circuit B, respectively, can be reduced, and reliability of the electrostatic destruction protect circuit A with respect to electrostatic destruction can be improved particularly. Needless to say, breakdown of the gate of MESFET $Q_1$ is much likely to occur.

According to experiments carried out by the present inventor, the Schottky junction in MESFET $Q_1$ and the diode $D_1$ undergoes breakdown when a voltage of about 50 V is applied. The electrostatic destruction protect circuit A is a circuit which absorbs electrostatic energy by the division of the electrostatic energy, but its breakdown voltage is the same as that of MESFET $Q_1$.

The electrostatic destruction protect structure using the regions 7A and 7B can absorb greater electrostatic energy by further dividing the electrostatic energy, and is extremely unlikely to undergo breakdown because it does not utilize the Schottky junction.

Since the electrostatic energy applied to the electrostatic destruction protect circuit A can be reduced by using the arrangement of the present invention to absorb some of this energy, the resistance value of the resistance element R can be reduced. Also, since the diodes $D_1$ and $D_2$ can be made compact, the input capacity to the input terminal BP can be reduced, so that the transmission delay time of the input signal can be reduced.

Figure 5:
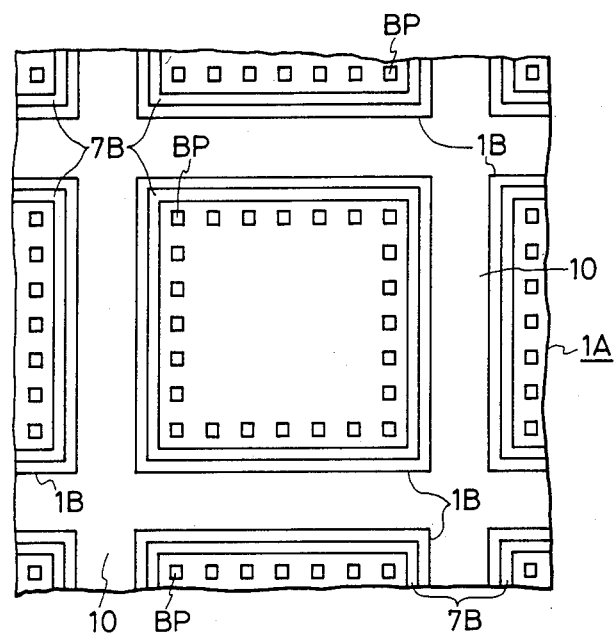
FIG. 5 is a plan view useful for explaining the first embodiment of the invention.

Preferably, the semiconductor region 7B has a great area in order to absorb the electrostatic energy. In this embodiment, the semiconductor region 7B is formed in such a manner as depicted in FIG. 5. In the drawing, reference numeral 1A represents a wafer; 1B is an area which is to serve as one chip upon dicing; and 10 is a dicing area in order to divide the wafer 1A into a plurality of chips 1B. The semiconductor region 7B is formed as one continuous region along the side of the chip 1B outside the input terminal BP.

According to the arrangement described above, the semiconductor region 7B can have a sufficiently large area. Since the semiconductor region 7B is formed outside the input terminal BP, it does not become an obstacle for the layout of the electrostatic destruction protect circuit and the internal circuit. In addition, an integration (packing) density does not drop because the areas between the sides of the chip 1B and the input erminal BP, which can hardly be used for forming a semiconductor device, is utilized.

In FIG. 5, the portions other than the region 7B and the input terminal BP are omitted. Though not shown in the drawing, the region 7B is connected by the wiring 6 to the input terminal BP to which the ground potential GND of the circuit is applied.

The semiconductor region 7B may be formed inside the dicing area 10 in such a manner as to encompass each chip 1B. Alternatively, the dicing area 10 may be formed as a whole as an $n^+$-type region 7B. In these two cases, caustion must be taken lest the wiring layer 6 formed over the region 7B for applying the ground potential is cut. In addition, the region 7A connected to the input terminal BP must be formed in the vicinity of the region 7B.

Figure 7:
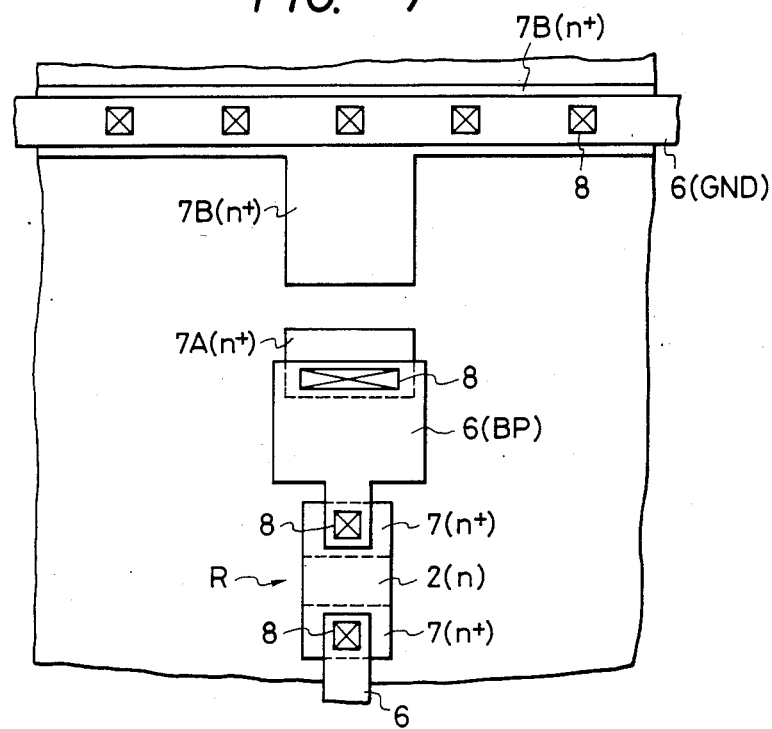
FIGS. 7, 8 and 9 are plan views showing the construction of the input portion of semiconductor integrated circuit devices in accordance with other embodiments of the present invention, respectively.
Figure 8:
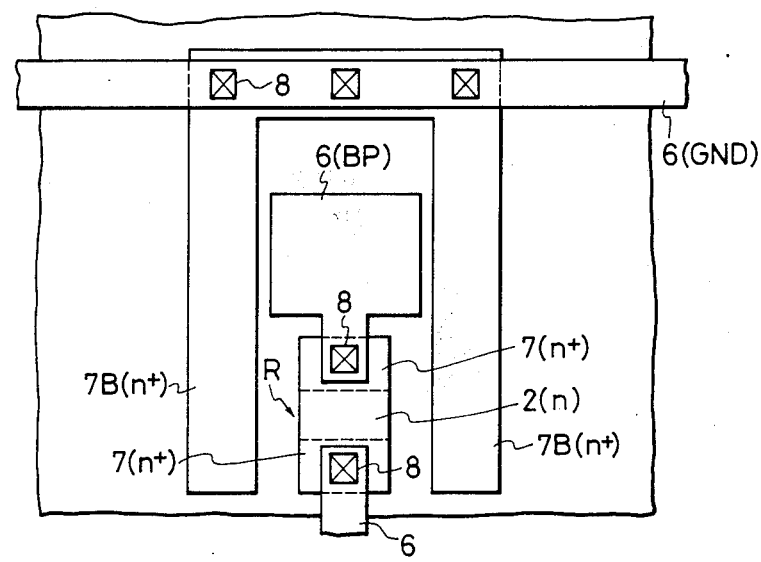
Figure 9:
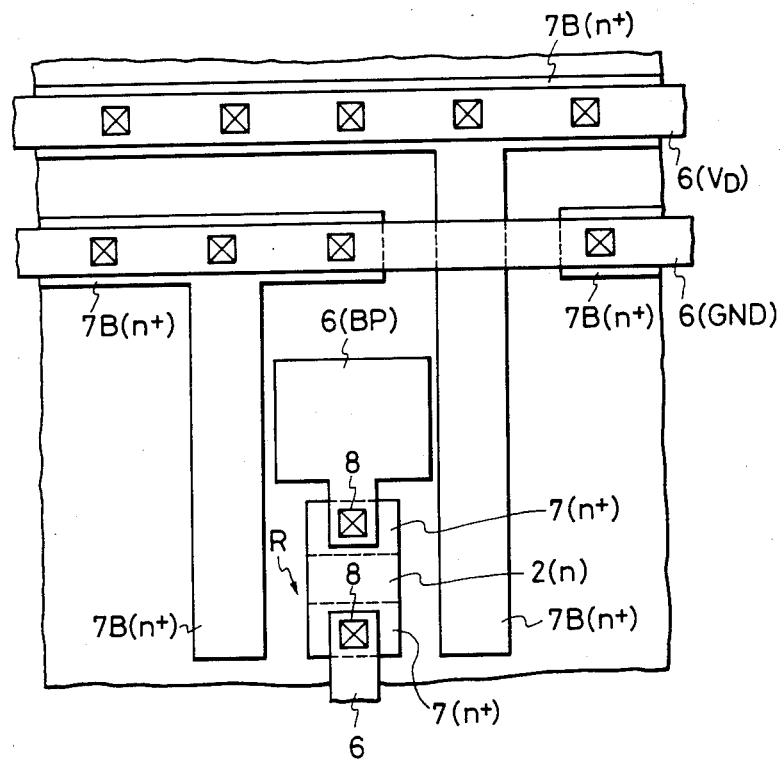

The semiconductor region 7B may assume various shapes as typified in FIGS. 7 through 9.

The semiconductor region 7B may be formed in such a manner that part of the region 7B projects and this projecting portion faces the region 7A with a predetermined distance between them as shown in FIG. 7.

FIG. 8 shows an example wherein the region 7B is formed in such a manner as to encompass the bonding pad BP as the input terminal with the region 7A being deleted. The function of the region 7A is borne by the region 7 which is connected to the bonding pad BP and to the region 2 as the resistor R. The region 2 and the other region 7 connected to the region 2 have substantially the same function as the region 7A. The regions 7B face the region 2 as the resistor R and the region 7 continuing the region 2 on both of their ends.

In the example shown in FIG. 8, the region 7A connected to the bonding pad BP may also be added. Furthermore, the region 7B may be formed so as to continue another region 7B formed for another input terminal BP or may be connected to another region 7B by the wiring layer 6.

The voltage to be applied to the region 7B may be a fixed potential other than the ground potential. FIG. 9 shows an example wherein a first region 7B to which the ground potential GND is applied and a second region 7B to which the power source potential $V_D$ is applied are shown formed. In FIG. 9, the region 7A is deleted, and the region 2 as the resistor R and the region 7 continuing the former 2 bear substantially the same function as that of the region 7A. THe first and second regions 7B are formed independently of each other along the sides of the chips outside the input terminal BP in the same way as in the example shown in FIG. 5. Part of each region 7B projects, and this projecting portion is formed on both sides of the resistor R with a predetermined distance between them. The first inner region 7B is partially cut in order to extend the second outer region 7B to the side of the resistor R. The first region 7B thus divided is kept at the same potential by the wiring layer 6.

In the example shown in FIG. 9, a region 7A connected to the bonding pad BP may be added.

In the example shown in FIG. 9, another fixed potential such as $-1.0$ V or $-2.0$ V ($-V_D$) may be added to either one of the first and second regions 7B.

Figure 10:
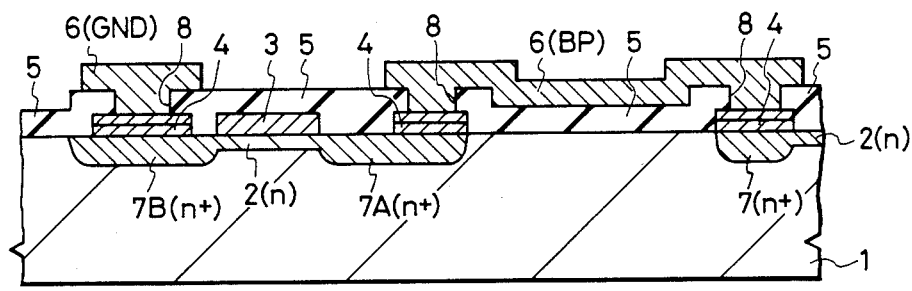
FIG. 10 is a sectional view showing still another embodiment of the present invention.

FIG. 10 shows another embodiment of the present invention and is a sectional view substantially corresponding to FIG. 2. In this drawing, a region 2 which is formed simultaneously with the channel region 2 of the normally-off type MESFET $Q_1$ is formed between the regions 7A and 7B, and a tungsten silicide layer 3 is disposed on the region 2. The potential of the tungsten silicide layer is a floating potential. The semiconductor region 2 is contained in a depletion region formed from and inside the Schottky junction with the mtal layer 3. The semiconductor regions 7A and 7B are non-conductive when a normal input signal (e.g. 0.7 V) is applied, and become conductive at a voltage of higher than about 5 V. The turn-on voltage hardly depends upon the distance between the regions 7A and 7B.

This embodiment can be regarded as an embodiment wherein a parasitic normally-off type MESFET is formed by the regions 7A, 7B and the electrode 3.

In the embodiment shown in FIG. 10, the depletion layer containing therein the region 2 may be formed by an insulating film 5 consisting of an $SiO_2$ film formed on the region 2.

Figure 11:
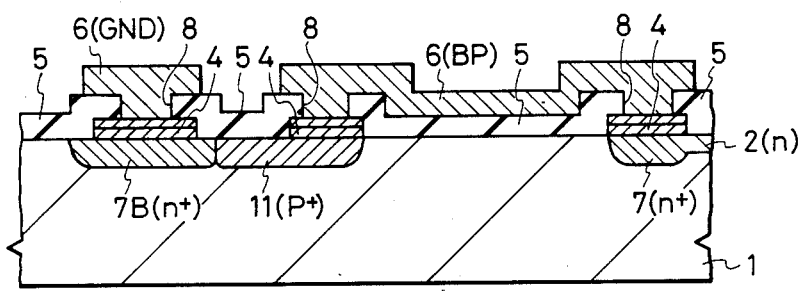
FIG. 11 is a sectional view showing still another embodiment of the present invention.

FIG. 11 shows still another embodiment of the present invention and is a sectional view substantially corresponding to FIG. 2. In this drawing, a $p^+$-type semiconductor region 11 connected to the input terminal BP is formed in place of the region 7A. The electrostatic energy is absorbed by the P-N junction formed by the regions 7B and 11. When a voltage of about 1.0 V, for example, is applied to the input terminal BP, the energy flows into the region 7B through the region 11.

Although the present invention has thus been described definitely in its preferred forms, the invention is not particularly limited thereto but can of course be modified in various manners without departing from the scope and spirit thereof.

Figure 12:
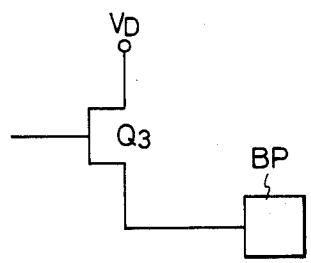
FIG. 12 is a circuit diagram showing an output circuit to which the electrostatic destruction protect structure of the present invention can be applied.

For example, the present invention can be applied to the output portion of a semiconductor integrated circuit device such as shown in FIG. 12. The n+-type source region of MESFET $Q_3$ of the final stage of the output circuit or a n+-type region which is connected to the output terminal BP other than the above source can be regarded as the region 7A.

Also, the electrostatic destruction protect circuit A itself may be another one of well-known types.

The present invention is effective for preventing the electrostatic destruction of the semiconductor integrated circuit device using the GaAs substrate from the electrostatic energy applied to the external terminal of the circuit device.

What is claimed is:

1. A semiconductor device formed in a semi-insulator substrate comprising:
    an internal circuit including a MESFET formed in said semi-insulator substrate;
    an electrostatic destruction protect circuit formed in said semi-insulator substrate;
    external terminals formed over said semi-insulator substrate;
    a first semiconductor region of a first conductivity type formed in said semi-insulator substrate and connected to said external terminals; and
    a second semiconductor region of the first conductivity type formed in said semi-insulator substrate and receiving a predetermined fixed potential, said second semiconductor region being formed as one continuous region along a periphery of said semi-insulator substrate and formed apart from said first semiconductor region with a predetermined distance so that said first and second semiconductor regions form a protection means for said MESFET and said electrostatic destruction protect circuit,
    wherein said MESFET formed in said semi-insulator substrate in said internal circuit comprises source and drain regions of the first conductivity type, a channel region and a Schottky gate electrode formed on said channel region, said channel region being shallower than said source and drain regions and having a lower impurity concentration than said source and drain regions,
    wherein said electrostatic destruction protect circuit is connected to said external terminals and includes a resistance element having one of the ends thereof connected to said external terminal with the other end being connected to said Schottky gate electrode of said internal circuit, and
    wherein said first semiconductor region includes said resistance element of said electrostaic destruction protect circuit.

2. A semiconductor device according to claim 1, wherein said resistance element is formed by the same production step as said channel region of said MESFET.

3. A semiconductor device formed in a semi-insulator substrate comprising:
    an internal circuit including a MESFET formed in said semi-insulator substrate;
    an electrostatic destruction protect circuit formed in said semi-insulator substrate;
    external terminals formed over said semi-insulator substrate;
    a first semiconductor region of a first conductivity type formed in said semi-insulator substrate and connected to said external terminals; and
    a second semiconductor region of the first conductivity type formed in said semi-insulator substrate and receiving a predetermined fixed potential, said second semiconductor region being formed as one continuous region along a periphery of said semi-insulator substrate and formed apart from said first semiconductor region with a predetermined distance so that said first and second semiconductor regions form a protection means for said MESFET and said electrostatic destruction protect circuit,
    wherein said MESFET formed in said semi-insulator substrate in said itnernal circuit comprises source and drain regions of the first conductivity type, a channel region and a Schottky gate electrode formed on said channel region, said channel region being shallower than said source and drain regions and having a lower impurity concentration than said source and drain regions,
    wherein said electrostatic destruction protect circuit is connected to said external terminals and includes a resistance element having one of the ends thereof connected to said external terminal with the other end being connected to said Schottky gate electrode of said internal circuit, and
    wherein said electrostatic destruction protect circuit includes Schottky diodes connected to the other end of said resistance element, said Schottky diodes comprising regions which are formed by the same production step as said Schottky gate electrode and said channel region of said MESFET.

4. A semiconductor device according to claim 1, wherein said resistance element is formed by the same production step as said channel region of said MESFET, and wherein said electrostatic destruction protect circuit includes Schottky diodes connected to the other end of said resistance element, said Schottky diodes comprising regions which are formed by the same production step as said Schottky gate electrode and said channel region of said MESFET.

5. A semiconductor device according to claim 4, wherein said semi-insulator substrate is formed of gallium arsenide.

6. A semiconductor device according to claim 4, wherein said second semiconductor region is coupled to said fixed potential by wiring having a lower resistance value than said second semiconductor region.

7. A semiconductor device according to claim 4, wherein said external terminal sare input terminals.

* * * * *